(12) United States Patent
Band

(10) Patent No.: US 6,858,352 B1
(45) Date of Patent: Feb. 22, 2005

(54) PRINTED CIRCUIT FABRICATION

(75) Inventor: Cyril William Band, Chipping Norton (GB)

(73) Assignee: Isis Innovation Limited (GB)

( * ) Notice: Subject to any disclaimer, the term of this patent is extended or adjusted under 35 U.S.C. 154(b) by 0 days.

(21) Appl. No.: 10/019,686

(22) PCT Filed: May 7, 2000

(86) PCT No.: PCT/GB00/02571

§ 371 (c)(1),
(2), (4) Date: Feb. 7, 2002

(87) PCT Pub. No.: WO01/05200

PCT Pub. Date: Jan. 18, 2001

(30) Foreign Application Priority Data

Jul. 8, 1999 (GB) .............................................. 9916060

(51) Int. Cl.⁷ ............................. G03F 9/00; H01B 13/00
(52) U.S. Cl. .............................................. 430/5; 216/17
(58) Field of Search ................................ 430/5; 216/13, 216/17

(56) References Cited

U.S. PATENT DOCUMENTS

| 3,775,119 A | 11/1973 | Bemis |
| 5,019,486 A | 5/1991 | Takakura |
| 5,790,383 A | 8/1998 | Inagawa |
| 5,989,754 A | * 11/1999 | Chen et al. ..................... 430/5 |
| 6,210,843 B1 | * 4/2001 | Chen et al. ..................... 430/5 |

FOREIGN PATENT DOCUMENTS

| DE | 19 36 775 A | 3/1971 |
| DE | 41 31 065 A1 | 3/1993 |
| GB | 784 673 A | 10/1957 |

OTHER PUBLICATIONS

"Laser Scribed Labyrinte Type Circuit for Circuit Board"; IBM Technical Disclosure Bulletin; Armonk, NY; vol. 32, No. 6B; pp. 359–361; Nov. 1989; XP000073766.
Tanaka, Yasuo et al; "Three Micron Meter Copper Foil Clad Laminate for 30/30 MCRON Meter Line/Space Circuit"; Circuitree; pp. 40–44; Nov. 1997; XP000978483.
"Subractive Etch Promoting Dummy Lines"; IBM Technical Disclosure Bulletin; Armonk, NY; vol. 32, No. 3B; p. 323; Aug. 1989; XP000029839.

* cited by examiner

Primary Examiner—Mark F. Huff
Assistant Examiner—Saleha Mohamedulla
(74) Attorney, Agent, or Firm—Nixon & Vanderhye PC

(57) ABSTRACT

A mask for producing a printed circuit board is defined in which the conductor elements of the printed circuit pattern are delineated by a constant width etch band (20). This means that all conductors (3a, 3b, 9) are separated from neighboring areas of conductive material (22) by the same distance. Thus etch rates across the printed circuit pattern do not vary according to the separation of the conductors (3a, 3b, 9).

10 Claims, 2 Drawing Sheets

PRINTED CIRCUIT FABRICATION

This application is the US national phase of international application PCT/GB00/02571 filed 5 Jul. 2000, which designated the US.

The present invention relates to the fabrication of printed circuits and in particular to methods of producing such printed circuits by etching a desired conductor pattern into a layer of conductive material on a substrate.

Printed circuit boards which consist of a pattern of conductive material, usually copper, on a substrate, such as a resin board, are well known and widely used in the electronics industry. Conventional methods for producing such printed circuits involve the preparation of a uniform layer of conductive material, usually copper, on a support, such as the resin board (though flexible supports are increasingly being used), the desired conductor pattern then being etched into the conductive material. This etching process involves first putting a mask of resist in the desired pattern on the conductive material and then spraying the conductive layer with an etchant to remove those areas of the conductor which are not masked by the resist. The pattern of resist is conventionally produced by laying down a uniform layer of photo resist, which is then exposed to a pattern of UV light corresponding to the desired circuit pattern (or its negative). Areas of the resist which have been exposed (or not exposed in the negative process) are then dissolved away. Usually the pattern of UV light is created by using a mask, or photographic master, which itself is in the pattern of the desired printed circuit or its negative. Such masks can be produced by various techniques such as laser plotting or conventional photography.

With the miniaturization of electronic devices printed circuits of finer and finer resolution are required all the time. At the moment printed circuits having a fine resolution include conductors of widths as narrow as 150 microns. However, there is a need for printed circuits with conductors much narrower than this, down to 30 microns or below, even in the range 10 to 12 microns. A problem with producing such fine circuits is that the circuits often contain imperfections, such as the narrowest conductors being of varying width, or even broken. This places limits on the fineness of the resolution which can be achieved.

The present invention provides an improved method for producing printed circuit boards in which the problems associated with producing very narrow conductor elements when etching a printed circuit are reduced. In particular the present invention proposes that the conductor elements of the circuit should be delineated by etched regions of constant width. In other words, they should be separated from regions of unused conductor by a constant width etch band. This means that, as compared with a conventional printed circuit, there will be large areas of unused conductor (e.g. copper) left on the circuit board. Conventionally all such unused areas would be etched away. However with the present invention they are left on the printed circuit board, and just separated from the conductors by the constant width etch bond.

Thus the present invention involves a modification to the method of producing the mask which is used to define the resist pattern for the etching process. The mask is designed so that the desired printed circuit pattern is delineated by a constant width etch band.

The etch band is preferably of the same width of the narrowest conductor separation or conductor in the printed circuit. It is particularly useful where the printed circuit conductor pattern includes conductor regions less than about 30 microns wide or spaced by less than about 30 microns.

With the present invention the same amount of conductor needs to be etched away along all conductor elements. With a conventional printed circuit board some areas where the conductors are very closely spaced will require less copper to be etched away than areas where there are very few conductors, or whether conductors are widely spaced. It is this difference in the amount of conductor which needs to be etched away which causes variations in etch rate. The local etch rate varies according to the amount of local conductor which has to be etched away. Because with the present invention the amount of local conductor which has to be etched away is constant (because it consists of a constant width etch band delineating the conductors) the etch rate is the same over the whole pattern. Thus the width of the conductors which is produced is relatively constant and problems of undue narrowing of conductors, undercutting of conductors by etchant, and breaking of conductors are reduced.

The invention will be further described by way of non-limitative example with reference to the accompanying drawings in which:—

Figure 1:
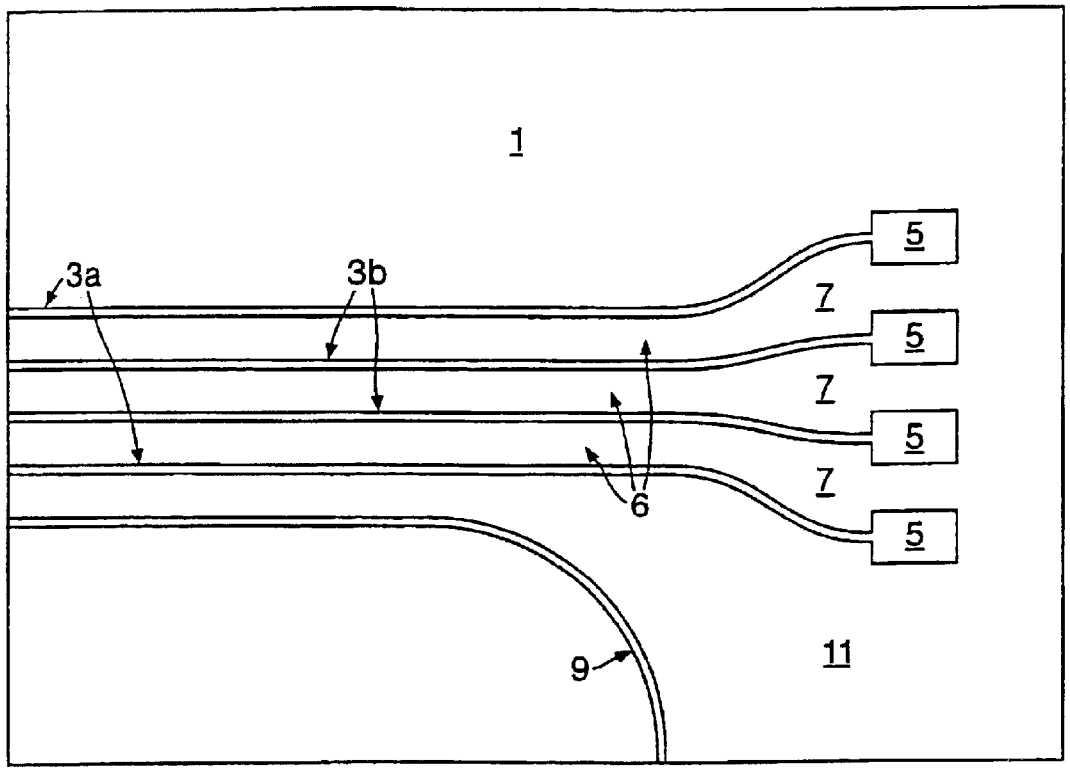
FIG. 1 illustrates schematically a conventional printed circuit pattern.
Figure 2:
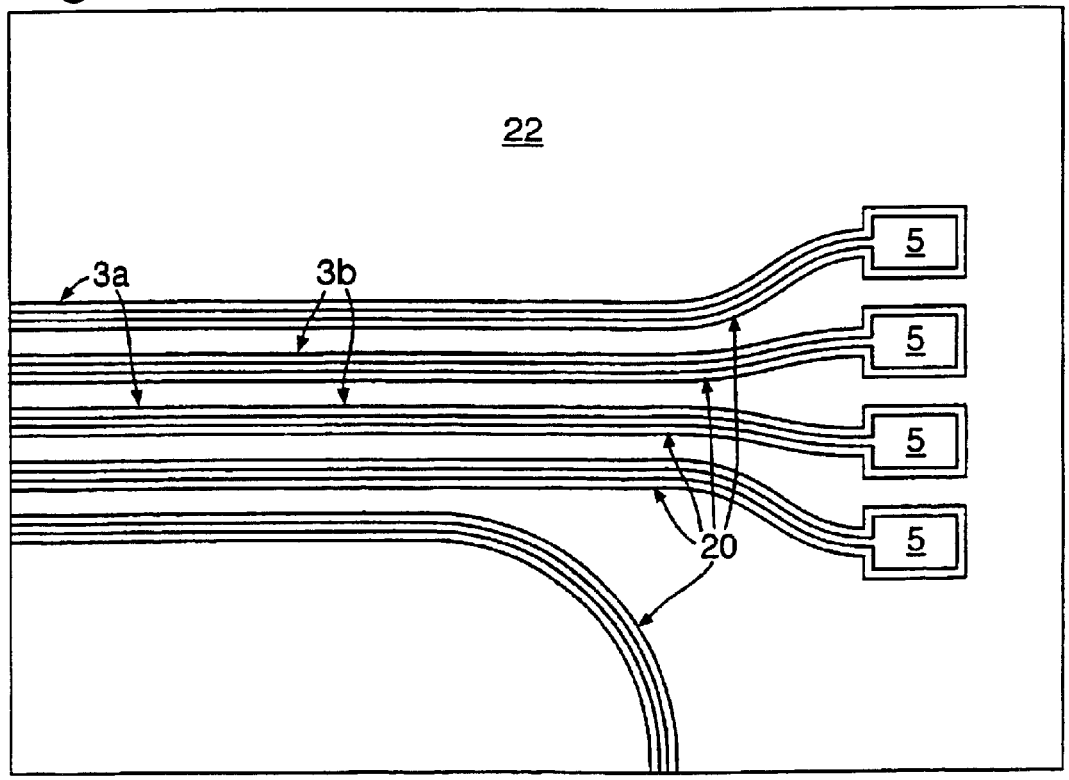
FIG. 2 illustrates the corresponding pattern according to the present invention.

FIG. 1 shows schematically a very simply printed circuit which the present invention can be applied. FIG. 1 illustrates the circuit in conventional form and FIG. 2 illustrates the modification according to the invention. As can be seen in FIG. 1 the printed circuit is defined on a substrate 1 and consists of a set of parallel conductors $3a$, $3b$ and 9 of which the conductors $3a$ and $3b$ lead to contact pads 5 and the conductor 9 leads off to another region of the printed circuit. It can be seen that the spacing between the conductors varies across the patter, it being narrow in regions 6 where the conductors are parallel and closely spaced, while being wider in regions 7 and 11 near the contact pads and the edge of the printed circuit. It can also be seen that the conductor $3a$ has on one side a very narrow spacing to the neighbouring conductor $3b$ and on the other side a very wide area where all conductor has been etched away. Similarly the conductor 9 has, in region 11, areas on both sides where much conductor has been etched away. Where this pattern is produced at fine resolutions, such as the conductors being of 30 microns width or less, e.g. 10 to 12 microns, it is found that the width of the conductors produced varies in the different regions 6, 7 and 11. The etch rate would be lower in the regions 6 compared to the widely spaced regions 7 and 11. Thus given a constant etching time, the conductors would narrow (because of increased etching) in the regions approaching the contact pads or where the conductor extends to other parts of the printed circuit as at 11.

The present invention solves this problem by modifying the pattern of conductor which is produced in the etching process. The result of this modification is illustrated in FIG. 2. It can been seen that each of the conductor elements is now surrounded by a constant width etch band 20. The conductor elements are therefore separated from unused regions of conductor 22 by this constant width band. Thus the amount conductive material which needs to be etched away is now constant over the whole area of the illustrated pattern. This means that the etch rate will be the same over the whole pattern, and variations in width of the conductors produced will be much smaller.

Of course although FIG. 2 illustrates that only the constant width etch band 20 is etched away, it may be that there are remote regions of the printed circuit substrate which can be etched away without affecting the etch rate locally around the conductors. The invention is concerned with producing a constant etch rate around the conductor elements. Thus given a printed circuit product it may be that only certain regions need to include the constant width etch band delineating the conductors. Edge regions or regions which do not include fine conductors may be produced in a conventional way.

It will be appreciated that in a region where the conductors consist of parallel closely spaced elements, to enable the etch rates to be the same as the etch rate between such elements, the etch band must be of the same width as the spacing between the conductor elements. Often a constant mark-to-space ratio is used which means that the etch band can be of the same width as the narrowest conductor on the board.

Figure 3:
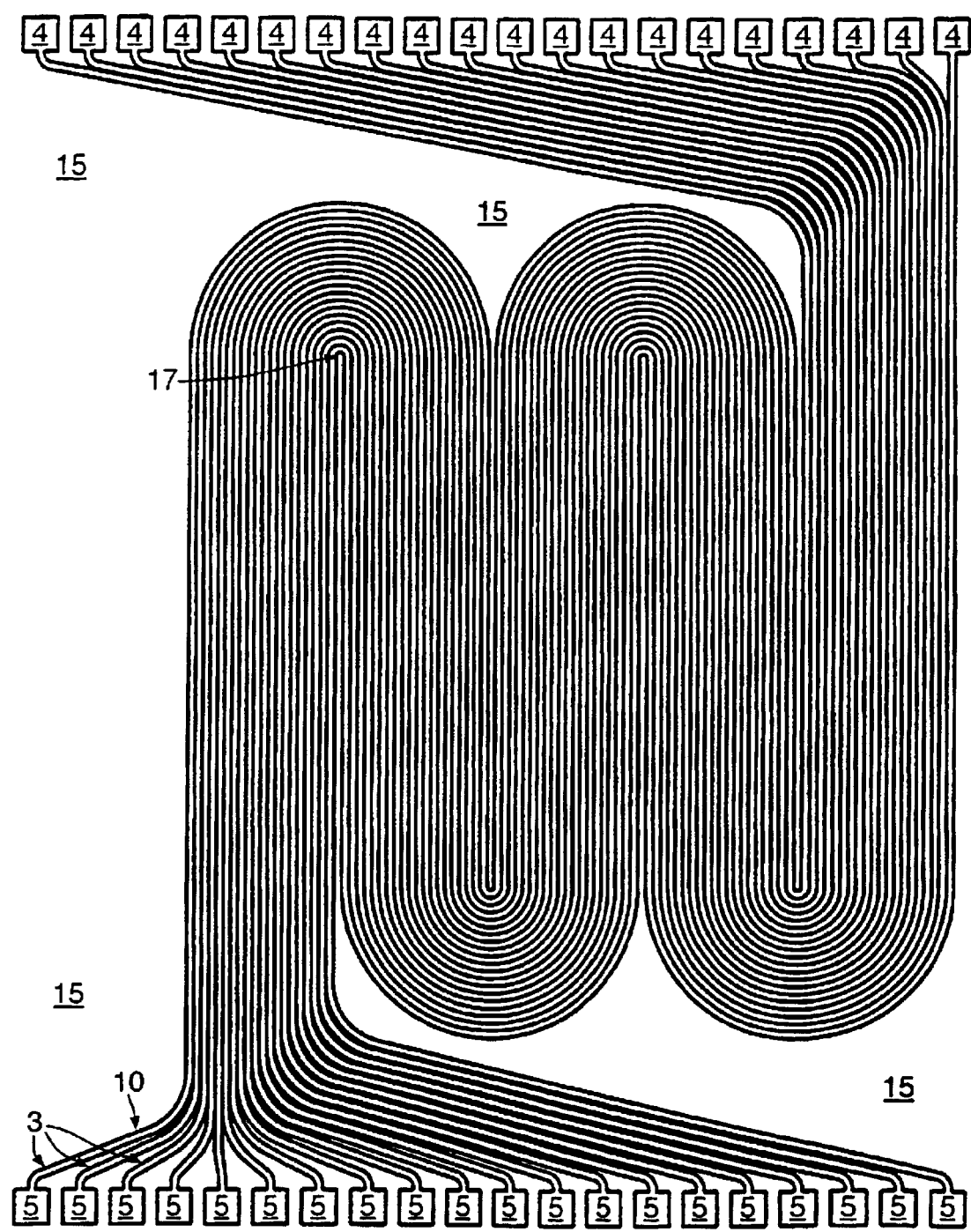
FIG. 3 illustrates at a magnified scale an actual mask produced by an embodiment of the present invention.

FIG. 3 is a magnified view of an actual mask designed according to an embodiment of the invention. The white areas correspond to areas of conductor which will be left on the printed circuit. Thus there are a plurality of contact pads 5 which are connected by conductor elements or "wires" 3 to another row of contact pads 4. In addition to these conductor elements it can be seen that there are large areas of unused conductor 15 which are left because the conductor pattern is delineated by the constant width etch band 10. The constant width etch band is of the same width of the separation between the conductors in the region 17 where they are a narrowly spaced.

While the present invention has been described as being applied in the design of the mask for using the etching process, it will of course be appreciated that it can be applied however the selective etching of conductor is achieved. Thus, for instance, it may be that the uniform layer of resist is illuminated in a scanning process, rather than by using a mask, or is written directly by a light beam. Alternatively the resist pattern may be produced by other means. However the present invention is still applicable in that the pattern of resist must define a constant width etch band delineating the desired conductor regions in the pattern.

What is claimed is:

1. A method of producing a printed circuit board mask for use in producing a resist pattern for etching of a printed circuit, comprising:

defining a desired pattern of conductor elements to be formed by etching away of conductive regions from a substrate carrying a conductive layer on its surface thereby to form the printed circuit;

defining a mask with reference to said desired pattern of conductor elements, the mask comprising masking elements for producing a resist pattern to be formed on the conductive layer on the substrate to leave exposed regions of said conductive layer to be etched away; and defining in the mask a constant width etch band delineating individual conductor elements in the desired printed circuit conductor pattern.

2. A method according to claim 1 wherein the etch band is of substantially the same width as the narrowest conductor or the narrowest separation between conductors in the printed circuit.

3. A method according to claim 1 wherein the etch band separates the desired printed circuit conductor pattern from regions of unused conductor on the printed circuit.

4. A method according to claim 1 wherein the printed circuit conductor pattern includes conductor regions less than about 30 microns wide.

5. A method according to claim 1 wherein the printed circuit conductor pattern includes conductor regions spaced by less than about 30 microns.

6. A method according to claim 1 wherein the etch band is less than about 30 microns wide.

7. A method of producing a printed circuit comprising a pattern of conductor elements, the method comprising the steps of: defining on a printed circuit substrate a pattern of resist to leave exposed regions of conductor to be etched away, the exposed regions comprising areas of constant width delineating the conductor elements and etching away said exposed regions of conductor.

8. A method according to claim 7 wherein the conductor elements include elements less than about 30 microns wide.

9. A method according to claim 7 wherein the pattern includes conductor elements spaced by less than about 30 microns.

10. A method according to claim 7 wherein the regions of constant width are of substantially the same width as the narrowest element or narrowest separation between elements in the printed circuit.

* * * * *

UNITED STATES PATENT AND TRADEMARK OFFICE
CERTIFICATE OF CORRECTION

PATENT NO. : 6,858,352 B1
DATED : February 22, 2005
INVENTOR(S) : Band

It is certified that error appears in the above-identified patent and that said Letters Patent is hereby corrected as shown below:

<u>Title page,</u>
Item [22], PCT Filing Date, "[22] PCT Filed: May 7, 2000" should read
-- [22] PCT Filed: July 5, 2000 --

Signed and Sealed this

Twenty-eighth Day of June, 2005

JON W. DUDAS
*Director of the United States Patent and Trademark Office*